US010402620B2

(12) United States Patent
Kim et al.

(10) Patent No.: US 10,402,620 B2
(45) Date of Patent: Sep. 3, 2019

(54) FAN-OUT SEMICONDUCTOR PACKAGE (71) Applicant: SAMSUNG ELECTRONICS CO., LTD., Suwon-si (KR)

(72) Inventors: Byung Ho Kim, Suwon-Si (KR); Da Hee Kim, Suwon-Si (KR); Joon Sung Kim, Suwon-Si (KR); Joo Young Choi, Suwon-Si (KR); Hee Sook Park, Suwon-Si (KR); Tae Wook Kim, Suwon-Si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/981,311

(22) Filed: May 16, 2018

(65) Prior Publication Data
US 2019/0130152 A1 May 2, 2019

(30) Foreign Application Priority Data
Oct. 27, 2017 (KR) .................. 10-2017-0141369

(51) Int. Cl.
*G06K 9/00* (2006.01)
*H01L 21/56* (2006.01)
(Continued)

(52) U.S. Cl.
CPC ....... *G06K 9/0002* (2013.01); *G06K 9/00053* (2013.01); *H01L 21/56* (2013.01);
(Continued)

(58) Field of Classification Search
CPC .............. H01L 23/053; H01L 23/055; H01L 23/49827; H01L 23/49838; H01L 23/528;
(Continued)

(56) References Cited

U.S. PATENT DOCUMENTS 8,717,775 B1 * 5/2014 Bolognia ........... G06K 9/00053
361/761
9,406,580 B2 8/2016 Erhart et al.
(Continued)

FOREIGN PATENT DOCUMENTS

KR 10-2016-0091253 A 8/2016

OTHER PUBLICATIONS

Taiwanese Office Action dated Feb. 19, 2019 issued in Taiwanese Patent Application No. 107117142 (with English translation).

*Primary Examiner* — David A Zarneke
(74) *Attorney, Agent, or Firm* — Sughrue Mion, PLLC (57) ABSTRACT A fan-out semiconductor package includes: a core member including a support layer, a first wiring layer, a second wiring layer, and through-vias and having a through-hole; a semiconductor chip disposed in the through-hole; an encapsulant covering the core member and the semiconductor chip and filling at least portions of the through-hole; a connection member including an insulating layer disposed on the first wiring layer and the semiconductor chip, a redistribution layer disposed on the insulating layer, first vias electrically connecting the redistribution layer and the connection pads to each other, and second vias electrically connecting the redistribution layer and the first wiring layer to each other; and a passivation layer disposed on the insulating layer and covering the redistribution layer, wherein a thickness of the passivation layer is within half a distance from an inactive surface of the semiconductor chip to a lower surface of the encapsulant.

21 Claims, 8 Drawing Sheets (51) Int. Cl.
    *H01L 23/00*     (2006.01)
    *H01L 23/31*     (2006.01)
    *H01L 23/053*    (2006.01)
    *H01L 23/055*    (2006.01)
    *H01L 23/498*    (2006.01)
    *H01L 23/522*    (2006.01)
    *H01L 23/528*    (2006.01)
    *H01L 23/538*    (2006.01)

(52) U.S. Cl.
    CPC .... *H01L 23/3128* (2013.01); *H01L 23/49816* (2013.01); *H01L 23/49822* (2013.01); *H01L 23/562* (2013.01); *H01L 24/09* (2013.01); *H01L 24/14* (2013.01); *H01L 24/49* (2013.01); *H01L 23/053* (2013.01); *H01L 23/055* (2013.01); *H01L 23/49827* (2013.01); *H01L 23/49838* (2013.01); *H01L 23/528* (2013.01); *H01L 23/5226* (2013.01); *H01L 23/5386* (2013.01); *H01L 24/23* (2013.01); *H01L 24/24* (2013.01); *H01L 2224/02377* (2013.01); *H01L 2224/02379* (2013.01); *H01L 2224/0401* (2013.01); *H01L 2224/18* (2013.01); *H01L 2924/15311* (2013.01); *H01L 2924/3511* (2013.01)

(58) Field of Classification Search
    CPC ............ H01L 23/5386; H01L 23/5226; H01L 23/562; H01L 24/23; H01L 24/24; H01L 2224/02379; H01L 2924/3511
    See application file for complete search history.

(56) References Cited

U.S. PATENT DOCUMENTS

| | | | | |
|---|---|---|---|---|
| 9,527,723 | B2* | 12/2016 | Lin | .......................... B81B 7/007 |
| 9,806,040 | B2* | 10/2017 | Liu | .......................... H01L 23/66 |
| 9,978,700 | B2* | 5/2018 | Lin | .......................... H01L 24/03 |
| 10,211,171 | B2* | 2/2019 | Liu | .......................... H01L 23/66 |
| 2016/0099210 | A1 | 4/2016 | Kwon et al. | |
| 2016/0343634 | A1 | 11/2016 | Erhart et al. | |
| 2017/0229426 | A1* | 8/2017 | Hung | ...................... H01L 25/50 |
| 2017/0243798 | A1 | 8/2017 | Park et al. | |
| 2017/0373030 | A1* | 12/2017 | Lee | .......................... H01L 24/06 |
| 2018/0190558 | A1* | 7/2018 | Hsu | ...................... H01L 23/3114 |
| 2018/0286823 | A1* | 10/2018 | Tai | .......................... H01L 24/02 |

* cited by examiner

FAN-OUT SEMICONDUCTOR PACKAGE

CROSS-REFERENCE TO RELATED APPLICATION(S)

This application claims the benefit of priority to Korean Patent Application No. 10-2017-0141369 filed on Oct. 27, 2017, in the Korean Intellectual Property Office, the disclosure of which is incorporated herein by reference in its entirety.

TECHNICAL FIELD

The present disclosure relates to a fan-out semiconductor package having a fingerprint recognition function.

BACKGROUND

The use of fingerprint sensors in smartphones, and the like, has become generalized, and the sizes of front displays of the smartphones have increased. In accordance with such a trend, various types of fingerprint sensor devices, for example, a fingerprint sensor device in which a fingerprint sensor is mounted on a ball grid array (BGA) substrate and is connected to the BGA substrate by bonding wires, a fingerprint device in which a fingerprint sensor is mounted beneath a BGA substrate in flip-chip form, and the like, have been developed.

SUMMARY

An aspect of the present disclosure may provide a fan-out semiconductor package in which sensing sensitivity may be improved by significantly reducing a sensing distance and which may be easily applied to an under display since it is advantageous in controlling a thickness and warpage.

According to an aspect of the present disclosure, a fan-out semiconductor package may include: a core member including a support layer, a first wiring layer disposed on an upper surface of the support layer, a second wiring layer disposed on a lower surface of the support layer, and through-vias penetrating through the support layer and electrically connecting the first and second wiring layers to each other and having a through-hole penetrating through the support layer; a semiconductor chip disposed in the through-hole and having an active surface having connection pads disposed thereon and an inactive surface opposing the active surface; an encapsulant covering the core member and the inactive surface of the semiconductor chip and filling at least portions of the through-hole; a connection member including an insulating layer disposed on the first wiring layer of the core member and the active surface of the semiconductor chip, a redistribution layer disposed on the insulating layer, first vias electrically connecting the redistribution layer and the connection pads to each other, and second vias electrically connecting the redistribution layer and the first wiring layer to each other; and a passivation layer disposed on the insulating layer and covering the redistribution layer, wherein a thickness of the passivation layer is within half a distance from the inactive surface to a lower surface of the encapsulant.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

The present disclosure may, however, be exemplified in many different forms and should not be construed as being limited to the specific embodiments set forth herein. Rather these embodiments are provided so that this disclosure will be thorough and complete, and will fully convey the scope of the disclosure to those skilled in the art.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

Herein, an upper portion, a lower portion, an upper side, a lower side, an upper surface, a lower surface, and the like, are decided in the accompanying drawings. For example, a first connection member is disposed on a level above a redistribution layer. However, the claims are not limited thereto. In addition, a vertical direction refers to the abovementioned upward and downward directions, and a horizontal direction refers to a direction perpendicular to the abovementioned upward and downward directions. In this case, a vertical cross section refers to a case taken along a plane in the vertical direction, and an example thereof may be a cross-sectional view illustrated in the drawings. In addition, a horizontal cross section refers to a case taken along a plane in the horizontal direction, and an example thereof may be a plan view illustrated in the drawings.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure.

In this case, singular forms include plural forms unless interpreted otherwise in context.

Electronic Device

Figure 1:
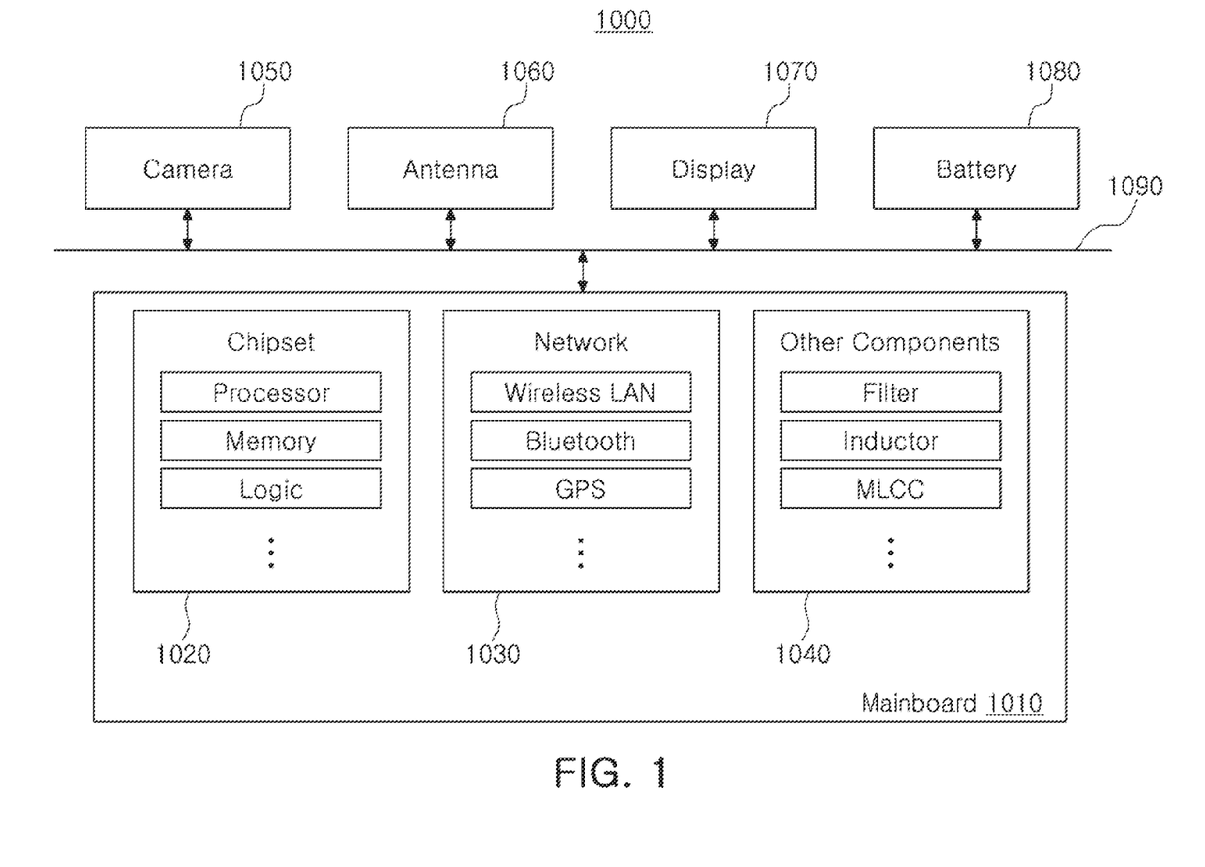
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+ (HSPA+), high speed downlink packet access+ (HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols.

However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
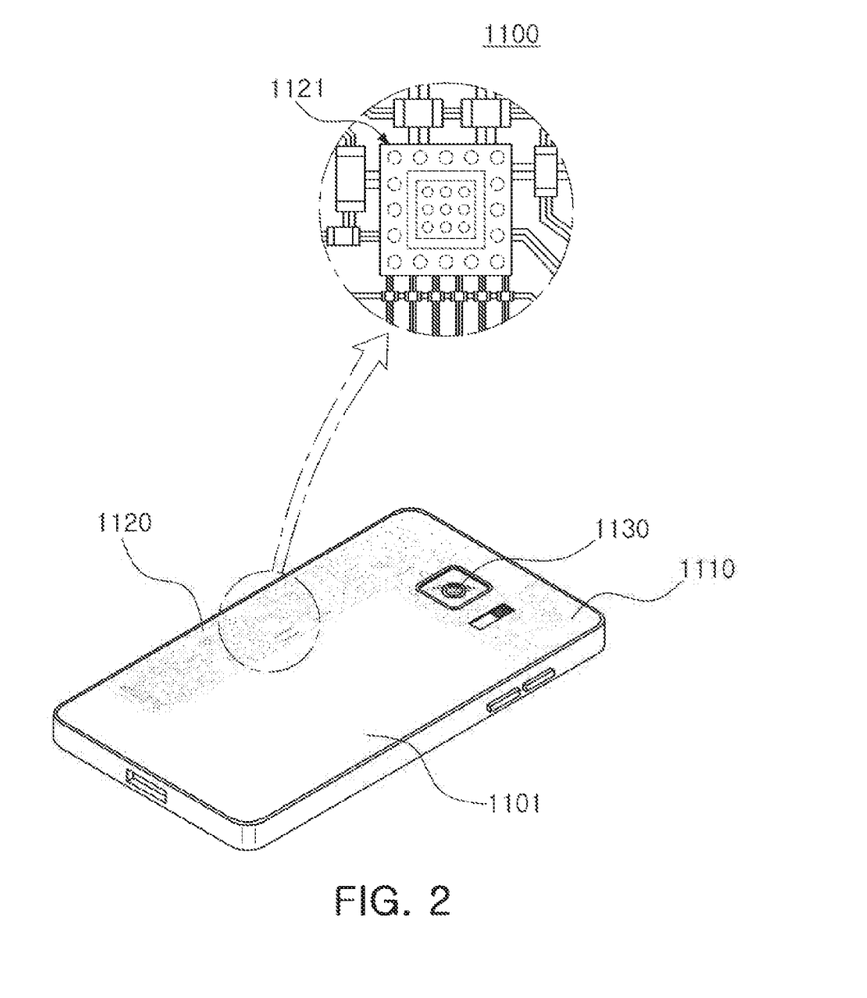
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a mainboard 1110 may be accommodated in a body 1101 of a smartphone 1100, and various electronic components 1120 may be physically or electrically connected to the mainboard 1110. In addition, other components that may or may not be physically or electrically connected to the mainboard 1110, such as a camera module 1130, maybe accommodated in the body 1101. Some of the electronic components 1120 may be the chip related components, for example, a semiconductor package 1121, but are not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a finished semiconductor product in itself, and may be damaged due to external physical or chemical impacts. Therefore, the semiconductor chip itself may not be used, but may be packaged and used in an electronic device, or the like, in a packaged state.

Here, semiconductor packaging is required due to the existence of a difference in a circuit width between the semiconductor chip and a mainboard of the electronic device in terms of electrical connections. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor chip and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the drawings.

Fan-In Semiconductor Package

Figure 3A:
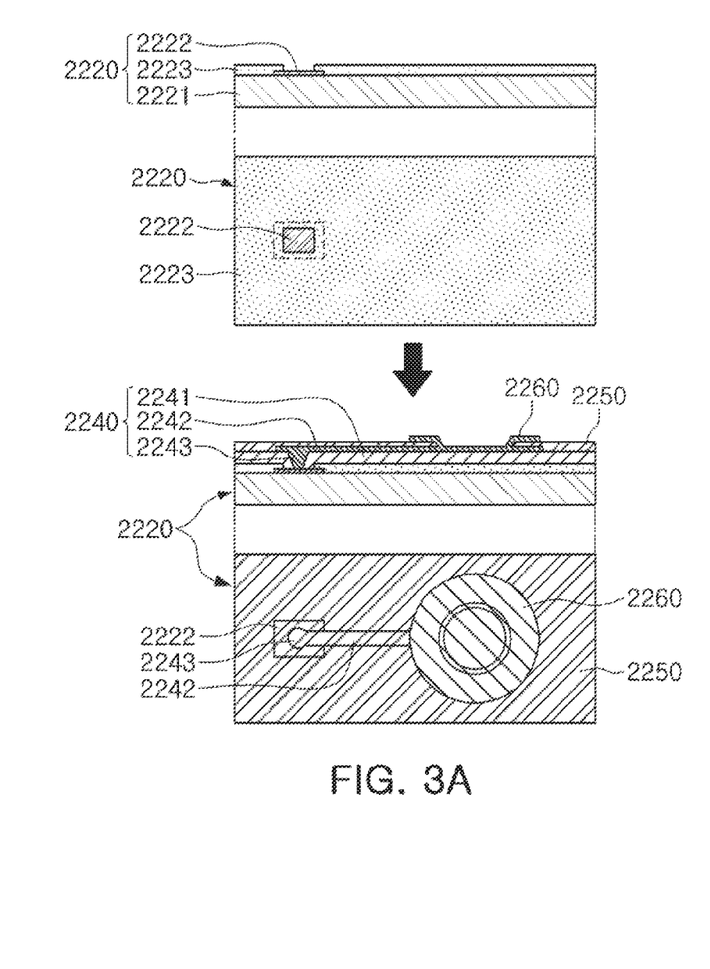
FIGS. 3A and 3B are schematic cross-sectional views illustrating states of a fan-in semiconductor package before and after being packaged.
Figure 3B:
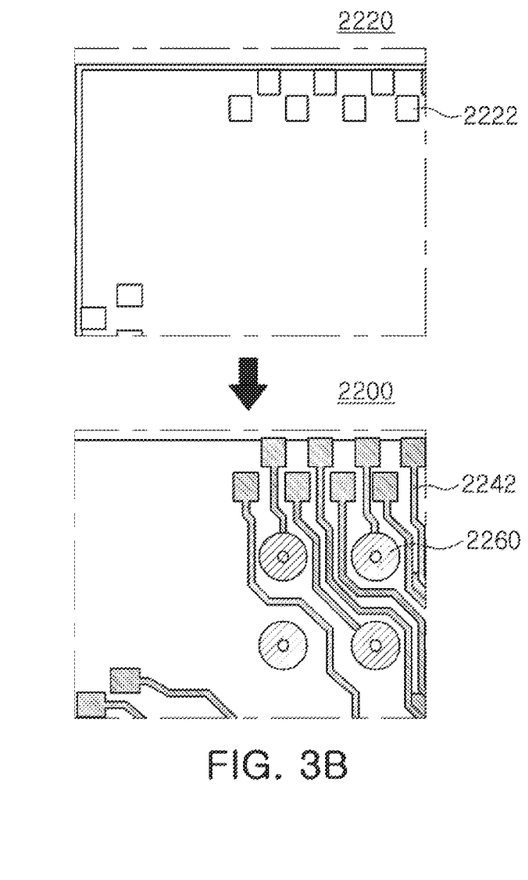

FIGS. 3A and 3B are schematic cross-sectional views illustrating states of a fan-in semiconductor package before and after being packaged.

Figure 4:
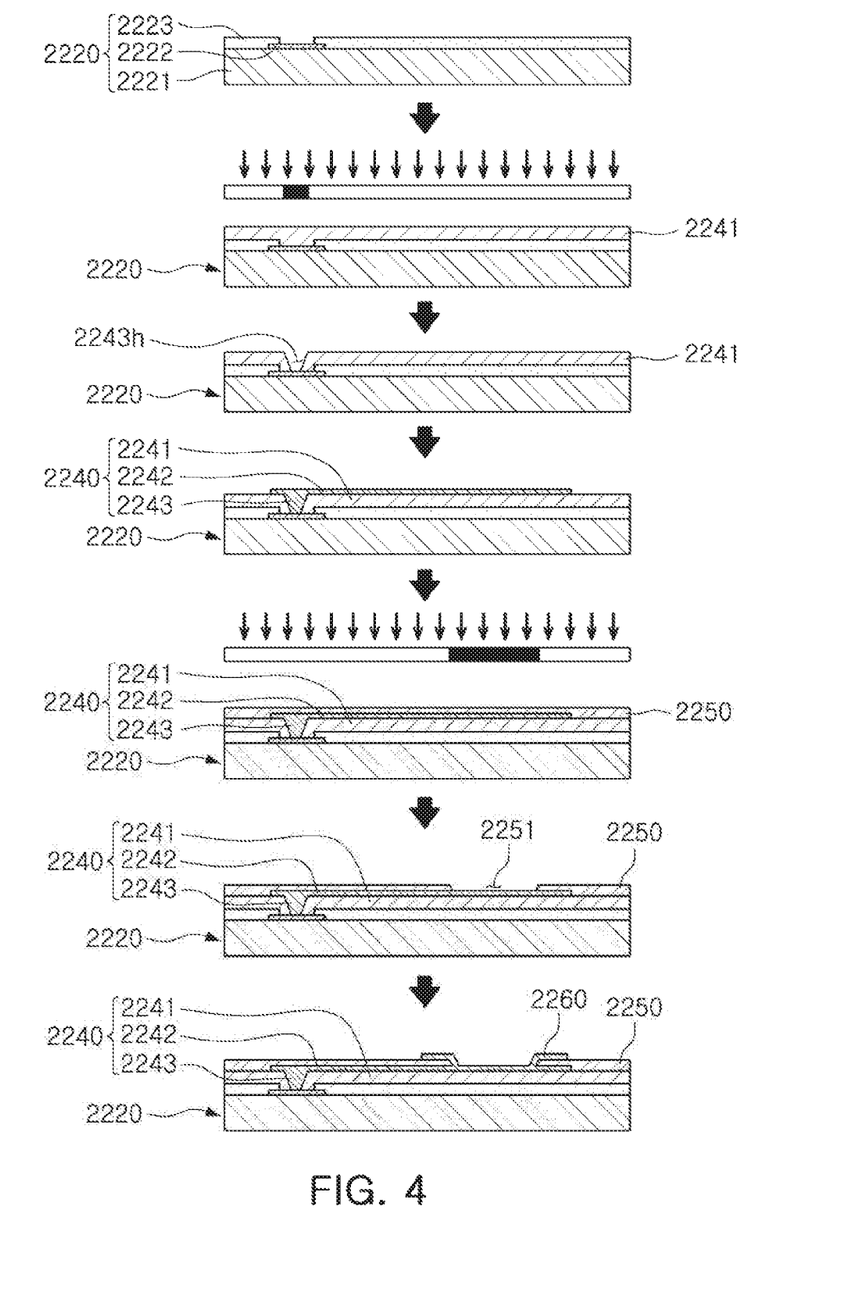
FIG. 4 is schematic cross-sectional views illustrating a packaging process of a fan-in semiconductor package.

FIG. 4 is schematic cross-sectional views illustrating a packaging process of a fan-in semiconductor package.

Referring to FIGS. 3 and 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using a photoimagable dielectric (PID) resin, forming via holes 2243h opening the connection pads 2222, and then forming wiring patterns 2242 and vias 2243. Then, a passivation layer 2250 protecting the connection member 2240 maybe formed, an opening 2251 maybe formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a compact size. In addition, due to the disadvantage described above, the fan-in semiconductor package may not be directly mounted and used on the mainboard of the electronic device. The reason is that even in a case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
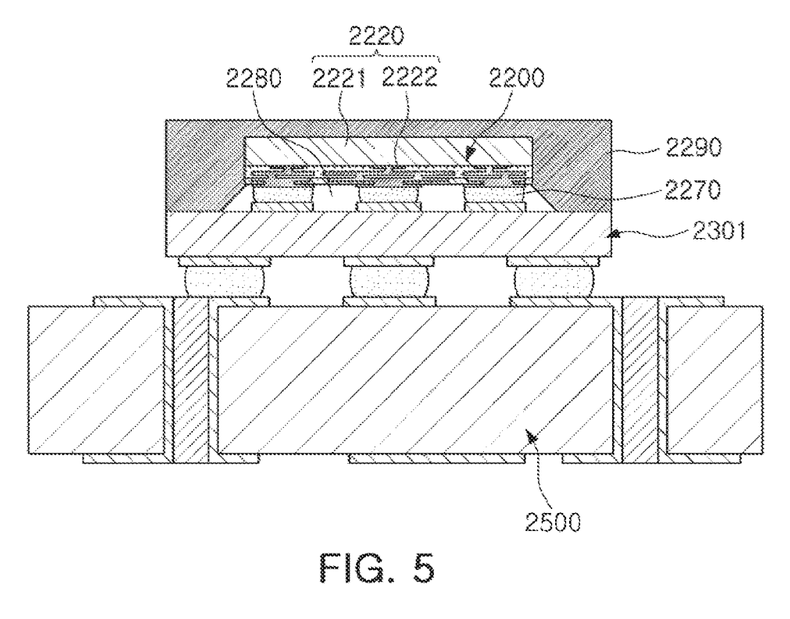
FIG. 5 is a schematic cross-sectional view illustrating a case in which a fan-in semiconductor package is mounted on a ball grid array (BGA) substrate and is ultimately mounted on a mainboard of an electronic device.

FIG. 5 is a schematic cross-sectional view illustrating a case in which a fan-in semiconductor package is mounted on a ball grid array (BGA) substrate and is ultimately mounted on a mainboard of an electronic device.

Figure 6:
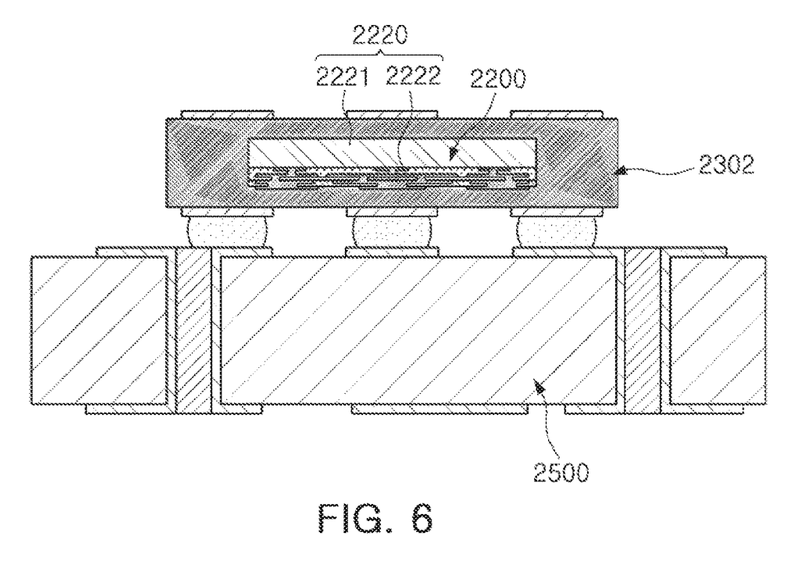
FIG. 6 is a schematic cross-sectional view illustrating a case in which a fan-in semiconductor package is embedded in a BGA substrate and is ultimately mounted on a mainboard of an electronic device.

FIG. 6 is a schematic cross-sectional view illustrating a case in which a fan-in semiconductor package is embedded in a BGA substrate and is ultimately mounted on a mainboard of an electronic device.

Referring to FIGS. 5 and 6, in a fan-in semiconductor package 2200, connection pads 2222, that is, I/O terminals, of a semiconductor chip 2220 may be redistributed through a BGA substrate 2301, and the fan-in semiconductor package 2200 may be ultimately mounted on a mainboard 2500 of an electronic device in a state in which it is mounted on the BGA substrate 2301. In this case, solder balls 2270, and the like, may be fixed by an underfill resin 2280, or the like, and an outer side of the semiconductor chip 2220 may be covered with a molding material 2290, or the like. Alternatively, a fan-in semiconductor package 2200 may be embedded in a separate BGA substrate 2302, connection pads 2222, that is, I/O terminals, of the semiconductor chip 2220 may be redistributed by the BGA substrate 2302 in a state in which the fan-in semiconductor package 2200 is embedded in the BGA substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate BGA substrate and be then mounted on the mainboard of the electronic device through a packaging process or may be mounted and used on the mainboard of the electronic device in a state in which it is embedded in the BGA substrate.

Fan-Out Semiconductor Package

Figure 7:
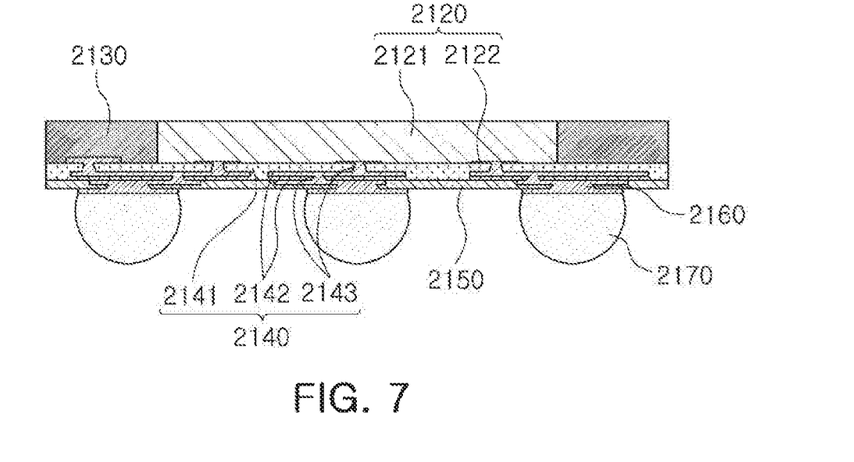
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like.

The connection member 2140 may include an insulating layer 2141, redistribution layers 2142 formed on the insulating layer 2141, and vias 2143 electrically connecting the connection pads 2122 and the redistribution layers 2142 to each other.

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in a case in which a size of the semiconductor chip is decreased, a standardized ball layout may be used in the fan-out semiconductor package as it is, such that the fan-out semiconductor package may be mounted on the mainboard of the electronic device without using a separate BGA substrate, as described below.

Figure 8:
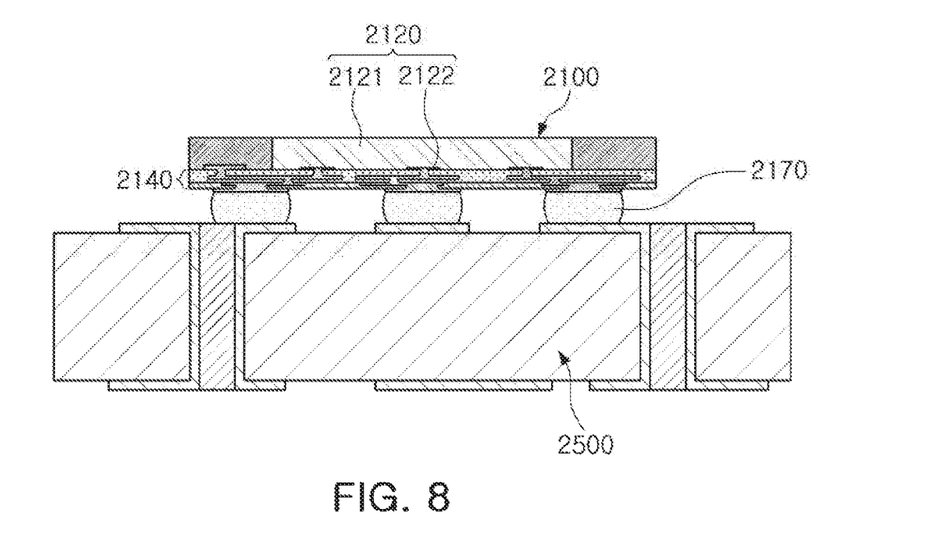
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 maybe mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate BGA substrate, or the like.

As described above, since the fan-out semiconductor package may be mounted on the mainboard of the electronic device without using the separate BGA substrate, the fan-out semiconductor package may be implemented at a thickness lower than that of the fan-in semiconductor package using the BGA substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as a BGA substrate, or the like, having a scale, a purpose, and the like, different from those of the fan-out semiconductor package, and having the fan-in semiconductor package embedded therein.

A fan-out semiconductor package to which such a fan-out semiconductor package technology is applied will hereinafter be described with reference to the drawings.

Figure 9:
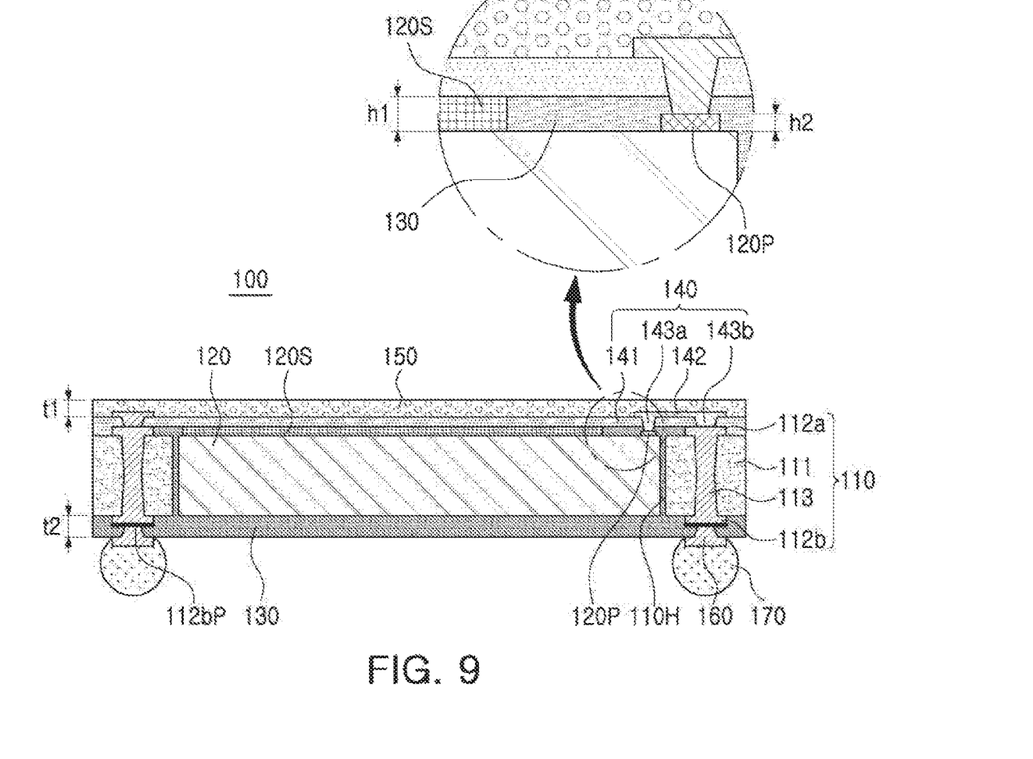
FIG. 9 is a schematic cross-sectional view illustrating an example of a fan-out semiconductor package.

FIG. 9 is a schematic cross-sectional view illustrating an example of a fan-out semiconductor package.

Figure 10:
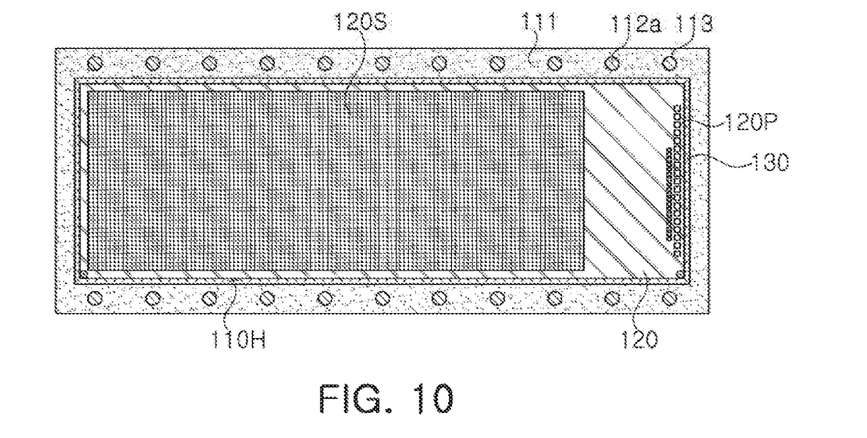
FIG. 10 is a schematic plan view illustrating a form of a fingerprint sensor and a core member of the fan-out semiconductor package of FIG. 9 when viewed from the top.

FIG. 10 is a schematic plan view illustrating a form of a fingerprint sensor and a core member of the fan-out semiconductor package of FIG. 9 when viewed from the top.

Figure 11:
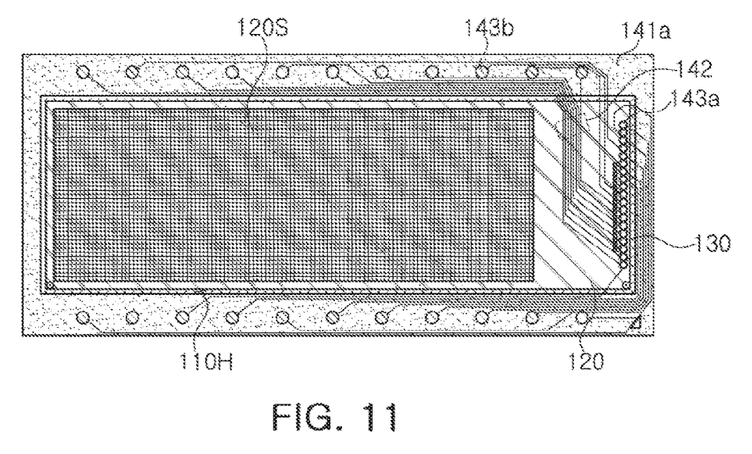
FIG. 11 is a schematic plan view illustrating a form of a fingerprint sensor and a connection member of the fan-out semiconductor package of FIG. 9 when viewed from the top.

FIG. 11 is a schematic plan view illustrating a form of a fingerprint sensor and a connection member of the fan-out semiconductor package of FIG. 9 when viewed from the top.

Referring to FIGS. 9 through 11, a fan-out semiconductor package 100 according to an exemplary embodiment in the present disclosure may include a core member 110 including a support layer 111, a first wiring layer 112a disposed on an upper surface of the support layer 111, a second wiring layer 112b disposed on a lower surface of the support layer 111, and through-vias 113 penetrating through the support layer 111 and electrically connecting the first and second wiring layers 112a and 112b to each other and having a through-hole 110H penetrating through the support layer 111, a semiconductor chip 120 disposed in the through-hole 110H and having an active surface having connection pads 120P and a sensing pattern 120S disposed thereon and an inactive surface opposing the active surface, an encapsulant 130 covering the core member 110 and the inactive surface of the semiconductor chip 120 and filling at least portions of the through-hole 110H, a connection member 140 including an insulating layer 141 disposed on the first wiring layer 112a and the active surface of the semiconductor chip 120, a redistribution layer 142 disposed on the insulating layer 141, and first and second vias 143a and 143b connecting the redistribution layer 142 to the connection pads 120P and the first wiring layer 112a, respectively, and a passivation layer 150 disposed on the insulating layer 141 and covering the redistribution layer 142. The connection pads 120P of the semiconductor chip 120 may be electrically connected to the core member 110 through the connection member 140, and may be electrically connected to electrical connection structures 170 through the core member 110, as described below. Therefore, the connection pads 120P of the semiconductor chip 120 may be electrically connected to the mainboard of the electronic device through the electrical connection structures 170. The semiconductor chip 120 may be a fingerprint sensor. A thickness t1 of the passivation layer 150 may be within half a thickness t2 from the inactive surface of the semiconductor chip 120 to a lower surface of the encapsulant 130. For example, $(t2 \times 40\%) \leq t1 \leq (t2 \times 45\%)$.

In a structure of a fingerprint recognition sensor according to the related art, a ball grid array (BTGA) substrate is generally used. For example, the fingerprint recognition sensor according to the related art has a form in which a fingerprint sensor is disposed on the BGA substrate, is electrically connected to the BGA substrate by bonding wires, and is then molded by a molding material. However, in such a structure, a separate sensing pattern layer having a fingerprint recognition function needs to be formed on the BGA substrate and the fingerprint sensor, and particularly, a molding thickness can not but be inevitably increased due to the bonding wires. Therefore, a sensing distance between the fingerprint sensor and a touch panel is significantly long, such that sensing sensitivity is decreased. In addition, the BGA substrate itself has a significant thickness, which is disadvantageous in thinness. In addition, warpage of a package greatly occurs due to an asymmetrical structure, such that a fingerprint sensing sensitivity is decreased, and a yield at the time of mounting the package on a board, or the like, is decreased.

On the other hand, the fan-out semiconductor package 100 according to the exemplary embodiment may have a structure in which the core member 110 having the wiring layers 112a and 112b is introduced instead of the BGA substrate, the semiconductor chip 120 on which the sensing pattern 120S capable of having a fingerprint recognition sensor function is formed is disposed in the through-hole 110H of the core member 110 and is then encapsulated by the encapsulant 130, and the connection pads 120P of the semiconductor chip 120 are electrically connected to the wiring layers 112a and 112b of the core member 110 using the connection member 140 having the redistribution layer 142 and the vias 143a and 143b. Therefore, a size and a thickness of the fan-out semiconductor package 100 according to the exemplary embodiment may be significantly decreased as compared to the structure of the fingerprint recognition sensor according to the related art, and a sensing distance may be significantly decreased.

Particularly, in the fan-out semiconductor package 100 according to the exemplary embodiment, warpage of the fan-out semiconductor package 100 may be controlled by the core member 110, the passivation layer 150, and the encapsulant 130. For example, after surface mounting technology (SMT) is performed on a substrate of the fan-out semiconductor package 100, the warpage of the fan-out semiconductor package 100 may be managed in a reflow process. In detail, basic rigidity of the fan-out semiconductor package 100 may be maintained by the core member 110, and the warpage of the fan-out semiconductor package 100 may be significantly decreased by controlling thicknesses of the passivation layer 150 and the encapsulant 130 disposed, respectively, on and beneath the core member 110 to be within the range described above. That is, when the thickness t1 of the passivation layer 150 is within half a thickness t2 from the inactive surface of the semiconductor chip 120 to the lower surface of the encapsulant 130, more preferably, $(t2 \times 40\%) \leq t1 \leq (t2 \times 45\%)$, a balance between upper and lower thicknesses may be stable to improve structural warpage stability. The structural warpage stability may be particularly excellent when the encapsulant 130 and the passivation layer 150 include a homogeneous insulating material. For example, the encapsulant 130 and the passivation layer 150 may include a homogeneous insulating resin and a homogeneous inorganic filler. More preferably, the encapsulant 130 and the passivation layer 150 may include a homogeneous Ajinomoto build-up film (ABF).

Meanwhile, in the fan-out semiconductor package 100 according to the exemplary embodiment, the encapsulant 130 may encapsulate side surfaces and the inactive surface of the semiconductor chip 120, and encapsulate at least portions of the connection pads 120P of the active surface of the semiconductor chip 120. In this case, the first vias 143a may penetrate through the insulating layer 141 and at least portions of the encapsulant 130, and the second vias 143b may penetrate through the insulating layer 141, but may not penetrate through the encapsulant 130. That is, the first via 143a may have a height greater than that of the second via 143b. The reason is that the sensing pattern 120S is disposed on a central portion and one side portion of the active surface, the connection pads 120P are disposed on the other side portion of the active surface, and a thickness h1 of the sensing pattern 120S is greater than a thickness h2 of each of the connection pads 120P. Through such a disposition, the connection pads 120P may be redistributed by a path as short as possible and be electrically connected to the electrical connection structures 170.

Meanwhile, the redistribution layer 142 may not be formed on the sensing pattern 120S of the semiconductor chip 120. That is, more components may be formed on the other side portion of the active surface than on the central portion and one side portion of the active surface in relation to the connection member 140. A metal ratio between the sensing pattern 120S and the redistribution layer 142 may be controlled through such a disposition to control a coefficient of thermal expansion (CTE). Resultantly, the warpage of the fan-out semiconductor package may be effectively controlled.

The respective components included in the fan-out semiconductor package 100 according to the exemplary embodiment will hereinafter be described in more detail.

The core member 110 may maintain rigidity of the fan-out semiconductor package 100 depending on certain materials, and serve to secure uniformity of a thickness of the encapsulant 130. The connection pads 120P of the semiconductor chip 120 may be electrically connected to the mainboard of the electronic device through the electrical connection structures 170, or the like, by the core member 110. The core member 110 may include a plurality of wiring layers 112a and 112b to effectively redistribute the first connection pads 120P of the semiconductor chip 120, and may provide a wide wiring design region to suppress redistribution layers from being formed in other regions. The semiconductor chip 120 may be disposed in the through-hole 110H to be spaced apart from the core member 110 by a predetermined distance. The side surfaces of the semiconductor chip 120 may be surrounded by the core member 110.

The core member 110 may include the support layer 111, the first wiring layer 112a disposed on the upper surface of the support layer 111, the second wiring layer 112b disposed on the lower surface of the support layer 111, and the through-vias 113 penetrating through the support layer 111 and electrically connecting the first and second wiring layers 112a and 112b to each other. The core member 110 may include a larger number of insulating layers, if necessary. In this case, the core member 110 may include larger numbers of wiring layers and via layers. For example, the wiring layer may be disposed between the insulating layers.

For example, a material including an inorganic filler and an insulating resin may be used as a material of the support layer 111. For example, a thermosetting resin such as an epoxy resin, a thermoplastic resin such as a polyimide resin, or a resin including a reinforcing material such as an inorganic filler, for example, silica, alumina, or the like, more specifically, ABF, FR-4, Bismaleimide Triazine (BT), a photoimagable dielectric (PID) resin, or the like, may be used. Alternatively, a material in which a thermosetting resin or a thermoplastic resin is impregnated together with an inorganic filler in a core material such as a glass fiber (or a glass cloth or a glass fabric), for example, prepreg, or the like, may also be used. In this case, excellent rigidity of the fan-out semiconductor package 100 may be maintained, such that the core member 110 may be used as a kind of support member. When the support layer 11 has a thickness of approximately 190 μm to 210 μm, particularly, the warpage of the fan-out semiconductor package 100 may be effectively controlled.

The wiring layers 112a and 112b may include a conductive material such as copper (Cu), aluminum(Al), silver (Ag), tin (Sn), gold (Au), nickel (Ni), lead (Pb), titanium(Ti), or alloys thereof. The wiring layers 112a and 112b may perform various functions depending on designs of corresponding layers. For example, the wiring layers 112a and 112b may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the wiring layers 112a and 112b may include pad patterns for vias, pad patterns for connection terminals, and the like. Thicknesses of the wiring layers 112a and 112b of the core member 110 may be greater than that of the redistribution layer 142 of the connection member 140. The reason is that the core member 110 may have a thickness similar to that of the semiconductor chip 120, but the connection member 140 needs to be thinned. A thickness of each of the wiring layers 112a and 112b may be approximately 9 μm to 11 μm. In this case, particularly, the warpage of the fan-out semiconductor package 100 may be effectively controlled.

The through-vias 113 may penetrate through the support layer 111 and electrically connect the first wiring layer 112a and the second wiring layer 112b to each other. A material of each of the through-vias 113 may be a conductive material. Each of the through-vias 113 may be completely filled with the conductive material, or the conductive material may be formed along a wall of each of via holes. Each of the through-vias 113 may be a through-via completely penetrating through the support layer 111, and may have a cylindrical shape or a hourglass shape, but is not limited thereto.

The semiconductor chip 120 may be an integrated circuit (IC) provided in an amount of several hundred to several million or more elements integrated in a single chip. The semiconductor chip 120 may be formed on the basis of an active wafer. In this case, a base material of a body may be silicon (Si), germanium (Ge), gallium arsenide (GaAs), or the like. Various circuits may be formed on the body. The connection pads 120P may electrically connect the semiconductor chip 120 to other components. A material of each of the connection pads 120P may be a conductive material such as aluminum (Al), or the like. The active surface of the semiconductor chip 120 refers to a surface of the semiconductor chip on which the connection pads 120P are disposed, and the semiconductor chip 120 may have the sensing pattern 120S disposed on the active surface and capable of performing fingerprint recognition sensor processing. That is, the semiconductor chip 120 may be a fingerprint sensor. The sensing pattern 120S may precisely detect a change in capacitance to perform fingerprint recognition, and may include, for example, a transfer transistor (Tx) pattern and a reset transistor (Rx) pattern. A passivation layer (not illustrated) covering at least portions of the connection pads 120P may be formed on the body, if necessary. The passivation layer (not illustrated) may be an oxide film, a nitride film, or the like, or be a double layer of an oxide layer and a nitride layer. An insulating layer (not illustrated), and the like, may also be further disposed in other required positions.

The encapsulant 130 may protect the semiconductor chip 120. An encapsulation form of the encapsulant 130 is not particularly limited, and may be a form in which the encapsulant 130 surrounds at least portions of the semiconductor chip 120. For example, the encapsulant 130 may cover the core member 110 and the inactive surface of the semiconductor chip 120, and fill at least portions of spaces between walls of the through-hole 110H and the side surfaces of the semiconductor chip 120. In addition, the encapsulant 130 may cover at least portions of the connection pads 120P of the active surface. The material of the encapsulant 130 is not particularly limited, but may be, for example, an insulating material. In this case, it may be preferable in terms of a control of the warpage of the fan-out semiconductor package that the encapsulant 130 includes the same kind of material as that of a passivation layer 150 to be described below as the insulating material. For example, the encapsulant 130 may include ABF including an insulating resin and an inorganic filler. The thickness t2 from the inactive surface of the semiconductor chip 120 to the lower surface of the encapsulant 130 may be, for example, approximately 43 μm to 47 μm. In this case, the warpage of the fan-out semiconductor package may be more effectively controlled. The encapsulant 130 may include a plurality of encapsulants. For example, the plurality of encapsulants may primarily fill the through-hole 110H, and secondarily cover the core member 110 and the inactive surface of the semiconductor chip 120. The plurality of encapsulants may include the same insulating material.

The connection member 140 may include the redistribution layer 142 that may redistribute the connection pads 120P of the semiconductor chip 120. Several tens to several hundreds of connection pads 120P having various functions may be redistributed by the connection member 140, and may be physically or electrically externally connected through the electrical connection structures 170 depending on the functions. The connection member 140 may include the insulating layers 141, the redistribution layers 142 disposed on the insulating layers 141, and the vias 143a and 143b connected to the redistribution layers 142.

A material of each of the insulating layers 141 may be an insulating material. In this case, a photosensitive insulating material such as a PID resin may also be used as the insulating material. This case may be advantageous in forming fine patterns. Materials of the insulating layers 141 may be the same as each other. The insulating layers 141 may be integrated with each other depending on processes, so that a boundary therebetween may not be readily apparent . A thickness of each of the insulating layers 141 may be, for example, approximately 5 μm to 7 μm. In this case, the warpage of the fan-out semiconductor package 100 may be more effectively controlled.

The redistribution layers 142 may include a conductive material such as copper (Cu), aluminum (Al), silver (Ag), tin (Sn), gold (Au), nickel (Ni), lead (Pb), titanium (Ti), or alloys thereof. The redistribution layers 142 may perform various functions depending on designs of corresponding layers. For example, the redistribution layers 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 142 may include pad patterns for vias, pad patterns for connection terminals, and the like. The redistribution layers 142 may include an ultra-high sensitivity fingerprint recognition pattern, if necessary. A thickness of each of the redistribution layers 142 may be, for example, approximately 9 μm to 11 μm. In this case, the warpage of the fan-out semiconductor package 100 may be more effectively controlled.

The redistribution layer 142 may not be formed on the sensing pattern 120S of the semiconductor chip 120. That is, more components may be formed on the other side portion of the active surface than on the central portion and one side portion of the active surface in relation to the connection member 140. A metal ratio between the sensing pattern 120S and the redistribution layer 142 may be controlled through such a disposition to control a coefficient of thermal expansion (CTE). Resultantly, the warpage of the fan-out semiconductor package may be effectively controlled.

The vias 143a and 143b may electrically connect the connection pads 120P, the redistribution layers 142, the first wiring layer 112a, and the like, formed on different layers to each other, resulting in an electrical path in the fan-out semiconductor package 100. A material of each of the vias 143a and 143b may be a conductive material such as copper (Cu), aluminum (Al), silver (Ag), tin (Sn), gold (Au), nickel (Ni), lead (Pb), titanium (Ti), or alloys thereof. Each of the vias 143a and 143b may be completely filled with the conductive material, or the conductive material may also be formed along a wall of each of the vias. In addition, each of the first to third vias 143a and 143b may have any shape known in the related art, such as a tapered shape, a cylindrical shape, and the like. The first vias 143a may electrically connect the redistribution layer 142 and the connection pads 120P to each other, and the second vias 143b may electrically connect the redistribution layer 142 and the first wiring layer 112a to each other.

The first vias 143a may penetrate through the insulating layer 141 and at least portions of the encapsulant 130, and the second vias 143b may penetrate through the insulating layer 141. That is, the first via 143a may have a height greater than that of the second via 143b. The reason is that the sensing pattern 120S is disposed on a central portion and one side portion of the active surface, the connection pads 120P are disposed on the other side portion of the active surface, and a thickness h1 of the sensing pattern 120S is greater than a thickness h2 of each of the connection pads 120P. Through such a disposition, the connection pads 120P may be redistributed by a path as short as possible and be electrically connected to the electrical connection structures 170.

The passivation layer 150 may protect the redistribution layer 142. The passivation layer 150 may include a homogenous insulating material to that of the encapsulant 130 in terms of the control of the warpage of the fan-out semiconductor package. For example, the passivation layer 150 may include a homogeneous ABF to that of the encapsulant 130, including a homogeneous insulating resin and a homogeneous inorganic filler to those of the encapsulant 130. The thickness t1 of the passivation layer 150 may be within half the thickness t2 from the inactive surface of the semiconductor chip 120 to the lower surface of the encapsulant 130. More preferably, $$(t2 \times 40\%) \leq t1 \leq (t2 \times 45\%).$$

In this case, the structural warpage stability of the fan-out semiconductor package 100 may be improved by controlling a balance between upper and lower portions of the fan-out semiconductor package 100. A thickness of the passivation layer 150 may be, for example, approximately 16 μm to 20 μm. This case may be advantageous particularly in controlling the warpage of the fan-out semiconductor package 100.

Underbump metal layers 160 may be additionally configured to improve connection reliability of the electrical connection structures 170 and improve board level reliability of the fan-out semiconductor package 100. The underbump metal layers 160 may be connected to the second wiring layer 112b exposed through openings of the encapsulant 130. In this case, a surface treatment layer 112bP may be formed on the exposed second wiring layer 112b. The surface treatment layer 112bP may include Ni-Au. In this case, Ni may have a thickness of, for example, 4 μm to 6 μm, and AU may have a thickness of, for example, 0.2 μm to 0.4 μm. The underbump metal layers 160 may be formed by any known metallization method using any known conductive material such as a metal, but are not limited thereto.

The electrical connection structures 170 may be additionally configured to physically or electrically externally connect the fan-out semiconductor package 100. For example, the fan-out semiconductor package 100 may be mounted on the mainboard of the electronic device through the electrical connection structures 170. Each of the electrical connection structures 170 may be formed of a conductive material, for example, a solder, or the like. However, this is only an example, and a material of each of the electrical connection structures 170 is not particularly limited thereto. Each of the electrical connection structures 170 may be a land, a ball, a pin, or the like. The electrical connection structures 170 maybe formed as a multilayer or single layer structure. When the electrical connection structures 170 are formed as a multilayer structure, the electrical connection structures 170 may include a copper (Cu) pillar and a solder. When the electrical connection structures 170 are formed as a single layer structure, the electrical connection structures 170 may include a tin-silver solder or copper (Cu). However, this is only an example, and the electrical connection structures 170 are not limited thereto.

The number, an interval, a disposition form, and the like, of electrical connection structures 170 are not particularly limited, but may be sufficiently modified depending on design particulars by those skilled in the art. For example, the electrical connection structures 170 may be provided in an amount of several tens to several millions according to the number of connection pads 120P of the semiconductor chip 120, or may be provided in an amount of several tens to several millions or more or several tens to several millions or less.

At least one of the electrical connection structures 170 may be disposed in a fan-out region. The fan-out region refers to a region except for a region in which the semiconductor chip 120 is disposed. That is, the fan-out semiconductor package 100 according to the exemplary embodiment may be a fan-out package. The fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be mounted on an electronic device without a separate board. Thus, the fan-out package may be manufactured to have a small thickness, and may have price competitiveness.

Meanwhile, a thickness of the fan-out semiconductor package 100, that is, a distance from an upper surface of the passivation layer 150 to the lower surface of the encapsulant 130 may be approximately, for example, 280 μm to 320 μm. In this case, the warpage of the fan-out semiconductor package 100 may be more effectively controlled. However, the thickness of the fan-out semiconductor package 100 is not limited thereto.

Figure 12:
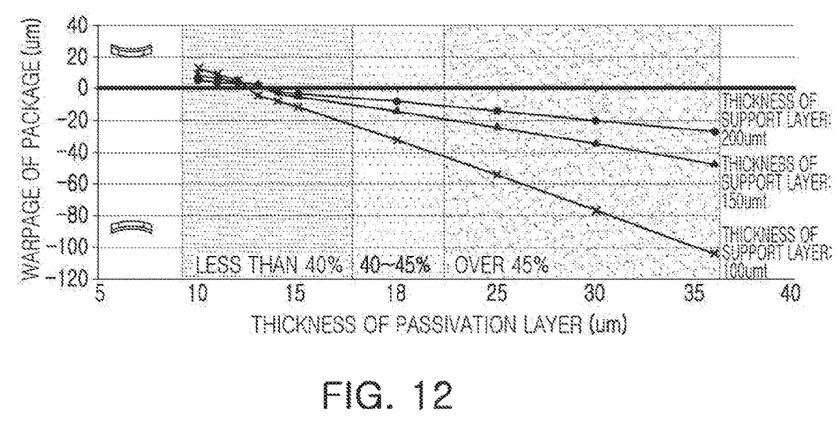
FIG. 12 is a schematic view illustrating a warpage control effect of the fan-out semiconductor package of FIG. 9.

FIG. 12 is a schematic view illustrating a warpage control effect of the fan-out semiconductor package of FIG. 9.

Referring to FIG. 12, it may be appreciated that the warpage of the fan-out semiconductor package may be most ideally controlled when the thickness t1 of the passivation layer 150 is within half, more preferably, within 45%, of the thickness t2 from the inactive surface of the semiconductor chip 120 to a lower surface of the encapsulant 130 and t1 is close to 18 μm. However, when t1 is less than 40% of t2, that is, when t1 is less than 16 μm, the thickness of the passivation layer 150 needs to be lowered more than necessary, and problems such as void and thickness dispersion may thus occur, and a problem may occur in drivability of the fan-out semiconductor package 100. That is, it may be appreciated that the warpage of the fan-out semiconductor package is most effectively controlled when t1 is in a range of 40% to 45% of t2 and t1 is 16 μm to 20 μm. Meanwhile, it is most ideal that t2 is 43 μm to 47 μm, and t2 was approximately 45 μm in a simulation. In addition, it may be appreciated that the warpage of the fan-out semiconductor package is most effectively controlled when a thickness of the support layer 111 is 190 μm to 210 μm, that is, is close to approximately 200 μm.

As set forth above, according to the exemplary embodiment in the present disclosure, a fan-out semiconductor package in which sensing sensitivity may be improved by significantly reducing a sensing distance and which may be easily applied to an under display since it is advantageous in controlling a thickness and warpage may be provided.

While exemplary embodiments have been shown and described above, it will be apparent to those skilled in the art that modifications and variations could be made without departing from the scope of the present invention as defined by the appended claims.

What is claimed is:

1. A fan-out semiconductor package comprising: a core member including a support layer and a first wiring layer disposed on an upper surface of the support layer, and having a through-hole penetrating through the support layer;
    a semiconductor chip disposed in the through-hole and having an active surface having connection pads disposed thereon and an inactive surface opposing the active surface;
    an encapsulant covering the core member and the inactive surface of the semiconductor chip and filling at least portions of the through-hole;
    a connection member including an insulating layer disposed on the first wiring layer of the core member and the active surface of the semiconductor chip, a redistribution layer disposed on the insulating layer, first vias electrically connecting the redistribution layer and the connection pads to each other, and second vias electrically connecting the redistribution layer and the first wiring layer to each other; and
    a passivation layer disposed on the insulating layer and covering the redistribution layer,
    wherein (t2×40%)≤t1≤(t2×45%) which t1 is the thickness of the passivation layer and t2 is the distance from the inactive surface to the lower surface of the encapsulant.

2. The fan-out semiconductor package of claim 1, wherein the semiconductor chip is a fingerprint sensor having a sensing pattern disposed on the active surface.

3. The fan-out semiconductor package of claim 1, wherein t1 is 16 μm to 20 μm, and t2 is 43 μm to 47 μm.

4. The fan-out semiconductor package of claim 1, wherein the encapsulant and the passivation layer include a homogeneous insulating material.

5. The fan-out semiconductor package of claim 4, wherein the encapsulant and the passivation layer include a homogeneous insulating resin and a homogeneous inorganic filler.

6. The fan-out semiconductor package of claim 4, wherein the encapsulant and the passivation layer include a homogeneous Ajinomoto build-up film (ABF).

7. The fan-out semiconductor package of claim 1, wherein the support layer includes prepreg, and
    a thickness of the support layer is 190 μm to 210 μm.

8. The fan-out semiconductor package of claim 1, wherein the insulating layer includes a photoimagable dielectric (PID) resin, and
    a thickness of the insulating layer is 5 μm to 7 μm.

9. The fan-out semiconductor package of claim 1, wherein the core member further comprises a second wiring layer disposed on a lower surface of the support layer, and through-vias penetrating through the support layer and electrically connecting the first and second wiring layers to each other.

10. The fan-out semiconductor package of claim 9, wherein each of the first and second wiring layers and the through-via includes copper (Cu), and
    a thickness of each of the first and second wiring layers is 9 μm to 11 μm.

11. The fan-out semiconductor package of claim 1, wherein the redistribution layer includes copper (Cu), and
    a thickness of the redistribution layer is 4 μm to 6 μm.

12. The fan-out semiconductor package of claim 9, wherein the first and second wiring layers have a thickness greater than that of the redistribution layer.

13. The fan-out semiconductor package of claim 2, wherein the sensing pattern has a thickness greater than that of the connection pads.

14. The fan-out semiconductor package of claim 12, wherein the first via has a height greater than that of the second via.

15. The fan-out semiconductor package of claim 13, wherein the first vias penetrate through the insulating layer and at least portions of the encapsulant, and
    the second vias penetrate through the insulating layer, but do not penetrate through the encapsulant.

16. The fan-out semiconductor package of claim 2, wherein the sensing pattern is disposed on a central portion and a first side portion of the active surface, and the connection pads are disposed on a second side portion of the active surface, and
    the redistribution layer is not formed on the sensing pattern of the semiconductor chip.

17. The fan-out semiconductor package of claim 9, further comprising:
    underbump metal layers formed in openings exposing at least portions of the second wiring layer of the encapsulant and electrically connected to the exposed second wiring layer; and
    electrical connection structures disposed on the encapsulant and connected to the underbump metal layers to thus be electrically connected to the exposed second wiring layer.

18. A fan-out semiconductor package comprising: a core member including a support layer and a first wiring layer disposed on an upper surface of the support layer, and having a through-hole penetrating through the support layer;
    a semiconductor chip disposed in the through-hole and having an active surface having connection pads disposed thereon and an inactive surface opposing the active surface;
    an encapsulant covering the core member and the inactive surface of the semiconductor chip and filling at least portions of the through-hole;
    a connection member including an insulating layer disposed on the first wiring layer of the core member and the active surface of the semiconductor chip, a redistribution layer disposed on the insulating layer, first vias electrically connecting the redistribution layer and the connection pads to each other, and second vias electrically connecting the redistribution layer and the first wiring layer to each other; and a passivation layer disposed on the insulating layer and covering the redistribution layer, wherein $(t2 \times 40\%) < t1 < (t2 \times 45\%)$ in which t1 is the thickness of the passivation layer and t2 is the distance from the inactive surface to the lower surface of the encapsulant.

19. The fan-out semiconductor package of claim 18, wherein a material of the passivation layer is the same as that of the encapsulant.

20. The fan-out semiconductor package of claim 18, wherein the semiconductor chip is a fingerprint sensor having a sensing pattern disposed on the active surface, and wherein the sensing pattern has a thickness greater than that of the connection pads.

21. The fan-out semiconductor package of claim 18, wherein the core member further comprises a second wiring layer disposed on a lower surface of the support layer, and through-vias penetrating through the support layer and electrically connecting the first and second wiring layers to each other.

* * * * *